US008269554B2

United States Patent
Zhu et al.

(10) Patent No.: US 8,269,554 B2
(45) Date of Patent: *Sep. 18, 2012

(54) SYSTEM AND METHOD FOR CONTROLLING RADIO FREQUENCY TRANSMISSIONS FROM AN ELECTRONIC DEVICE

(75) Inventors: Lizhong Zhu, Waterloo (CA); George Mankaruse, Kitchener (CA); Michael Corrigan, Waterloo (CA); Jun Xu, Waterloo (CA); Kent Nickerson, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/204,476

(22) Filed: Aug. 5, 2011

(65) Prior Publication Data

US 2012/0007670 A1 Jan. 12, 2012

Related U.S. Application Data

(63) Continuation of application No. 12/751,376, filed on Mar. 31, 2010, now Pat. No. 8,008,971, which is a continuation of application No. 11/627,115, filed on Jan. 25, 2007, now Pat. No. 7,724,084.

(51) Int. Cl.
*H03F 1/00* (2006.01)
*H03F 3/04* (2006.01)
(52) U.S. Cl. .......................... 330/66; 330/306
(58) Field of Classification Search .............. 330/66, 330/306
See application file for complete search history.

(56) References Cited

U.S. PATENT DOCUMENTS

| 5,146,178 | A | 9/1992 | Nojima et al. |
| 5,502,421 | A | 3/1996 | Nakahara |
| 5,535,438 | A | 7/1996 | Sevic |
| 6,081,161 | A | 6/2000 | Dacus et al. |
| 6,177,841 | B1 | 1/2001 | Ohta et al. |
| 6,392,491 | B1 | 5/2002 | Ohkawa et al. |
| 2002/0196085 | A1 | 12/2002 | Nakamata et al. |
| 2003/0022638 | A1 | 1/2003 | Imai et al. |
| 2003/0079900 | A1 | 5/2003 | Hahn et al. |
| 2006/0031806 | A1 | 2/2006 | Yunker |
| 2007/0057731 | A1 | 3/2007 | Le |

FOREIGN PATENT DOCUMENTS

CN  1324147 A  11/2001

(Continued)

OTHER PUBLICATIONS

Anonymous "BGY282. dual band UHF amplifier module for GSM900 and GSM900 and GSM1800" Discrete Semicondictors Data Sheet. Philips semiconductors. Dec. 4, 2001. From http://dat.

(Continued)

*Primary Examiner* — Robert Pascal
*Assistant Examiner* — Khiem Nguyen
(74) *Attorney, Agent, or Firm* — McCarthy Tétrault LLP

(57) ABSTRACT

The disclosure relates to a system and method for attenuating harmonics in a power amplifier. An electronic circuit for reducing leakage of radio frequency signals from a power amplifier of a wireless communication device is provided. The circuit comprises: a printed circuit board (PCB) having the power amplifier mounted on the PCB; a first electrical track in the PCB connecting to a power input terminal of the power amplifier; and a first capacitor connected to the first electrical track and a ground reference in the PCB, the first capacitor reducing transmission of radio frequency signals from the input terminal of the power amplifier.

14 Claims, 7 Drawing Sheets

FOREIGN PATENT DOCUMENTS

| | | |
|---|---|---|
| EP | 1156582 A2 | 11/2001 |
| GB | 567 352 | 2/1945 |
| JP | 2000-106510 | 4/2000 |
| JP | 2000 349514 | 12/2000 |
| JP | 2003-008469 | 1/2003 |
| JP | 2003-046452 | 2/2003 |
| JP | 2003-511945 | 3/2003 |
| JP | 2004-166248 | 6/2004 |
| KR | 2002-0061727 A | 7/2002 |
| WO | WO 01/28086 | 4/2001 |

OTHER PUBLICATIONS

Anonymous "BGY1916, UHF amplifier module" Discrete Semiconductors Data Sheet. Philips Semiconductors. May 27, 1998. From http://www.datasheetarchive.com/datasheet-pdf/023/dsa.

Anonymous. "PF08114B, MOS FET Power Amplifier Module for E-GSM and DCS1800 Dual Band Handy Phone" Renesas Data Sheet. Renesas Technology, Dec. 31, 2001. From http://www.datas.

SYSTEM AND METHOD FOR CONTROLLING RADIO FREQUENCY TRANSMISSIONS FROM AN ELECTRONIC DEVICE

RELATED APPLICATIONS

This application is a continuation application of U.S. patent application Ser. No. 12/751,376 filed Mar. 31, 2010 now U.S. Pat. No. 8,008,971, which is itself a continuation application of U.S. patent application Ser. No. 11/627,115 filed Jan. 25, 2007, now U.S. Pat. No. 7,724,084.

FIELD OF DISCLOSURE

The disclosure described herein relates to a system and method for controlling and adjusting output of a transmission of a transmitted radio frequency (RF) signal originating from a power amplifier in an electronic device to reduce levels of harmonics.

BACKGROUND

Current wireless handheld mobile communication devices perform a variety of functions to enable mobile users to stay current with information and communications, such as e-mail, corporate data and organizer information while they are away from their desks. Frequently such devices communicate with other devices using wireless transmissions. Such transmissions are generated by internal amplifiers and are transmitted through one or more antennae on the device. It is a common requirement that certain jurisdictions regulate transmission aspects of wireless devices. For devices sold in the United States, the Federal Communications Commission (FCC) regulates electrical characteristics of such transmissions. A set of FCC regulations imposes limitation on the amplitude of harmonics generated by such transmissions. Existing transmission circuits in communication devices tend to generate large signal harmonics around the fundamental transmission frequency. These harmonics may generate additional radio frequency noise that may not be in compliance with FCC regulations. There are usually three main sources of radio frequency noise from a power amplifier: signal harmonics present in the output signal of the power amplifier; harmonics and or noise generated due to a power and/or impedance mis-match between the output of the power amplifier and its related output circuit; and radio frequency transmissions generated from signals leaking from the input power circuit through the circuit traces on the printed circuit board (PCB) connecting the power amplifier to a power source (e.g. a battery, such as a lithium ion battery) and radiating from the device through the battery (e.g. through the case of the battery).

There is a need for a system and method which addresses deficiencies in the prior art.

BRIEF DESCRIPTION OF THE DRAWINGS

Embodiments of the disclosure will now be described, by way of example only, with reference to the accompanying drawings, in which.

DETAILED DESCRIPTION OF AN EMBODIMENT

Figure 1:
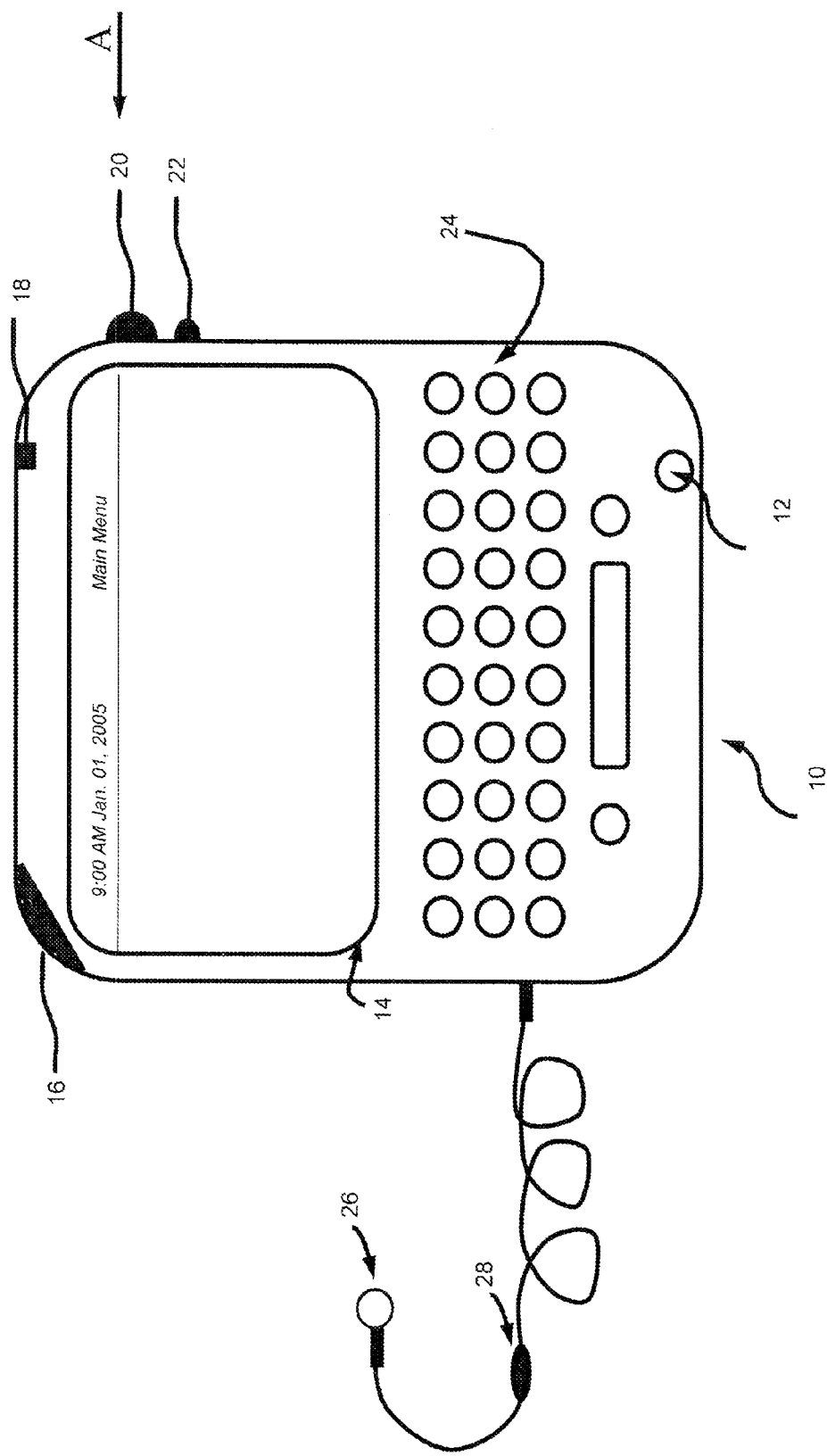
FIG. 1 is a schematic representation of an electronic device having a radio frequency (RF) transmission module in accordance with an embodiment.

The description which follows and the embodiments described therein are provided by way of illustration of an example or examples of particular embodiments of the principles of the present disclosure. These examples are provided for the purposes of explanation and not limitation of those principles and of the disclosure. In the description which follows, like parts are marked throughout the specification and the drawings with the same respective reference numerals.

In a first aspect, an electronic circuit for reducing leakage of radio frequency signals from a power amplifier of a wireless communication device is provided. The circuit comprises: a printed circuit board (PCB) having the power amplifier mounted on the PCB; a first electrical track in the PCB connecting to a power input terminal of the power amplifier; and a first capacitor connected to the first electrical track and a ground reference in the PCB, the first capacitor reducing transmission of radio frequency signals from the input terminal of the power amplifier.

The circuit may further comprise a first high filter choke having a first connection connecting to the first electrical track and the first capacitor and a second connection connecting to a battery.

In the circuit the first capacitor may provide a low pass filter to attenuate signals over the 2 GHz frequency band.

In the circuit the first capacitor may have a capacitance of 0.01 uF or 1000 pf.

The circuit may further comprise a second capacitor connected to the first electrical track between the input terminal and the first high filter choke.

In the circuit the first electrical track may be connected to a high band power input terminal of the power amplifier.

In the circuit a third capacitor may be provided between the high filter choke and the battery.

In the circuit the third capacitor may provide a low pass filter to attenuate signals over the 2 GHz frequency band.

The circuit may further comprise: a second electrical track connected to a low band power input terminal of the power amplifier; and a fourth capacitor connected to the second electrical track.

In the circuit, the fourth capacitor may have a capacitance of 0.01 uF or 33 pf.

The circuit may further comprise a fifth capacitor connected to the second track.

The circuit may further comprise a second high filter choke having a first connection connecting to the second electrical track and the second capacitor and a second connection connecting to the battery.

The circuit may further comprise: a filtering stage connected to an output terminal of the power amplifier; a harmonic filter providing a low pass filter having a frequency cut-off point that attenuates first order harmonics of the output signal; and a 0 ohm component located between the filtering stage and the harmonic filter to delay output signals from the power amplifier.

In the circuit, the 0 ohm component may be populated in a location for one component for a low pass filter, the location providing a connection between the filtering stage and the harmonic filter; and components for the low pass filter may not be populated in remaining locations for other components of the low pass filter.

In a second aspect, an electronic circuit for reducing leakage of radio frequency signals from a power amplifier of a wireless communication device is provided. The circuit comprises: a PCB having the power amplifier mounted on the PCB; a first electrical track in the PCB connecting to a power input terminal of the power amplifier; a first capacitor connected to the first electrical track and a ground reference in the PCB, the first capacitor reducing transmission of radio frequency signals from the input terminal of the power amplifier; a first high filter choke having a first connection connecting to the first electrical track and the first capacitor and a second connection connecting to a battery; and a second capacitor connected to the first electrical track between the input terminal and the first high filter choke.

In the circuit, a third capacitor may be provided between the high filter choke and the battery.

In the circuit, the third capacitor may provide a low pass filter to attenuate signals over the 2 GHz frequency band.

In the circuit, the first capacitor may provide a low pass filter to attenuate signals over the 2 GHz frequency band.

The circuit may further comprise: a filtering stage connected to an output terminal of the power amplifier; a harmonic filter providing a low pass filter having a frequency cut-off point that attenuates first order harmonics of the output signal; and a 0 ohm component located between the filtering stage and the harmonic filter to delay output signals from the power amplifier.

In another aspect, an electronic circuit for reducing leakage of radio frequency signals from a power amplifier of a wireless communication device is provided. The circuit comprises: a PCB having the power amplifier mounted on the PCB; a first electrical track in the PCB connecting to a power input terminal of the power amplifier; and a first capacitor connected to the first electrical track and a ground reference in the PCB, the first capacitor reducing transmission of radio frequency signals from the input terminal of the power amplifier.

The circuit may further comprise: a first high filter choke having a first connection connecting to the first electrical track and the first capacitor and a second connection connecting to a battery.

In the circuit, the first capacitor may provide a low pass filter to attenuate signals over the 2 GHz frequency band.

In the circuit, the first capacitor may have a capacitance of 0.01 uF or 1000 pf.

The circuit may further comprise a second capacitor connected to the first electrical track between the input terminal and the first high filter choke.

In the circuit, the first electrical track may be connected to a high band power input terminal of the power amplifier.

In the circuit, a third capacitor may be provided between the high filter choke and the battery.

In the circuit, the third capacitor may provide a low pass filter to attenuate signals over the 2 GHz frequency band.

The circuit may further comprise: a second electrical track connected to a low band power input terminal of the power amplifier; and a fourth capacitor connected to the second electrical track.

In the circuit, the fourth capacitor may have a capacitance of 0.01 uF or 33 pf.

The circuit may further comprise a fifth capacitor connected to the second track.

The circuit may further comprise: a second high filter choke having a first connection connecting to the second electrical track and the second capacitor and a second connection connecting to the battery.

The circuit may further comprise: a filtering stage connected to an output terminal of the power amplifier; a harmonic filter providing a low pass filter having a frequency cut-off point that attenuates first order harmonics of the output signal; and a 0 ohm component located between the filtering stage and the harmonic filter to delay output signals from the power amplifier.

In the circuit, the 0 ohm component may be populated in a location for one component for a low pass filter, the location providing a connection between the filtering stage and the harmonic filter; and components for the low pass filter may not be populated in remaining locations for other components of the low pass filter.

In yet another aspect, an electronic circuit for reducing leakage of radio frequency signals from a power amplifier of a wireless communication device is provided. The circuit comprises: a PCB having the power amplifier mounted on the PCB; a first electrical track in the PCB connecting to a power input terminal of the power amplifier; a first capacitor connected to the first electrical track and a ground reference in the PCB, the first capacitor reducing transmission of radio frequency signals from the input terminal of the power amplifier; a first high filter choke having a first connection connecting to the first electrical track and the first capacitor and a second connection connecting to a battery; and a second capacitor connected to the first electrical track between the input terminal and the first high filter choke.

In the circuit a third capacitor may be provided between the high filter choke and the battery.

In the circuit, the third capacitor may provide a low pass filter to attenuate signals over the 2 GHz frequency band.

In the circuit, the first capacitor may provide a low pass filter to attenuate signals over the 2 GHz frequency band.

The circuit may further comprise: a filtering stage connected to an output terminal of the power amplifier; a harmonic filter providing a low pass filter having a frequency cut-off point that attenuates first order harmonics of the output signal; and a 0 ohm component located between the filtering stage and the harmonic filter to delay output signals from the power amplifier.

In still another aspect, an electronic circuit for reducing harmonics of an output signal from a power amplifier in a radio frequency transmission circuit for a wireless communication device is provided. The circuit comprises: a PCB; a power amplifier for generating an output signal for the communication device; and a circuit implemented on the PCB connected to an output terminal of the power amplifier for the output signal. The circuit comprises a first filtering stage; a delay element and a harmonic filter. In the circuit, the delay element is located between the harmonic filter and the output terminal and the delay element provides a timing delay in the output signal through at least one 0 ohm-rated component. Also, the harmonic filter is a low pass filter having a frequency cut-off point that attenuates first order harmonics of the output signal.

In the electronic circuit, the delay element may be a 0 ohm component.

In the electronic circuit, the delay element may replace a component of a filter element in the circuit.

In the electronic circuit, the harmonic filter may implement the filter element that the delay element replaced.

In the electronic circuit, the filtering stage may comprise a notch filter to attenuate signals about a specific frequency band, such as the 5 GHz frequency band.

In the electronic circuit, the filtering stage may further comprise a low pass filter to attenuate signals over a specific frequency band, such as the 5 GHz frequency band.

In the electronic circuit, the delay element may replace a filter element in the circuit by utilizing an inductor in place of a component of the filter element.

In the electronic circuit, the delay element may comprise an alternative track in the PCB that is selectively connected to the circuit by insertion of at least one 0 ohm component to complete an electronic connection between the track and the circuit.

The electronic circuit may further comprise capacitors to reduce transmission of signals from the power amplifier in tracks in the PCB of a power connection circuit connecting the power amplifier to a battery for the amplifier.

In the electronic circuit, a set of the capacitors may be located in the power connection circuit between a high filter choke and the power amplifier. Further, the capacitors may provide a low pass filter to attenuate signals over the 2 GHz frequency band.

Additionally or alternatively, in the electronic circuit, capacitors may be located in the power connection circuit between the high filter choke and battery. Further, the capacitors may provide a low pass filter to attenuate signals over the 2 GHz frequency band.

Additionally or alternatively, the delay element may be a track in the PCB that has sufficient length providing a propagation delay for a signal to traverse the length to provide the timing delay.

Also, in the circuit, an input point of the circuit may be tuned to accommodate power and impedance characteristics of an output of the power amplifier.

In another aspect, a method of reducing harmonics of an output signal from a power amplifier in a radio frequency transmission circuit for a wireless communication device is provided. The method comprises: providing a first filtering stage for the output signal; providing a harmonic filter to the output signal after the first filtering stage; providing an output stage for the output signal after the harmonic filter; and providing a dedicated delay element before the harmonic filter for the output signal to impart a time delay for the output signal, causing harmonics of the output signal to be reduced. In the circuit, the harmonic filter is a low pass filter having a frequency cut-off point that attenuates first order harmonics of the output signal.

In the method, the delay element may be a 0 ohm component.

In the method, the delay element may replace a component of a filter element in the circuit.

The method may further comprise filtering transmission of signals from the power amplifier in a power connection circuit connecting the power amplifier to a battery for the amplifier.

The method may further implement features of circuits described in other aspects.

In other aspects, various combinations of sets and subsets of the above aspects are provided.

Generally, an embodiment provides a system and method for controlling the output of an RF transmission module of a wireless device. In particular, the RF transmissions are controlled such that harmonics of the output signal around their fundamental frequencies are dampened. An embodiment utilizes a delay element in the output circuit of an RF transmission to introduce a timing delay to the output signal for the RF transmission before it is provided to the antenna of the device. As will be seen, the delay introduces a time delay to the output signal, while maintaining the amplitude of the output signal, which has the effect of dampening harmonics relating to the fundamental frequencies of the output signals.

Exemplary details of embodiments are provided herein. First, a description is provided on general components of a device that incorporates an embodiment. Next, further detail is provided on exemplary features of a circuit for an embodiment.

FIG. 1 provides general features of a portable, electronic device in accordance with an embodiment, which is indicated generally at 10. Device 10 is based on a computing platform having functionality of an enhanced personal digital assistant with a cellphone and can receive and transmit wireless communications, including as email, SMS and voice communications. Electronic device 10 can be based on construction design and functionality of other electronic devices, such as smart telephones, desktop computers, pagers or laptops having telephony equipment. In a present embodiment, electronic device 10 includes a housing 12, an LCD 14, speaker 16, an LED indicator 18, a trackball 20, an ESC ("escape") key 22, keypad 24, a telephone headset comprised of an ear bud 26 and a microphone 28. Trackball 20 and ESC key 22 can be inwardly depressed along the path of arrow "A" as a means to provide additional input to device 10. It will be understood that housing 12 can be made from any suitable material as will occur to those of skill in the art and may be suitably formed to house and hold all components of device 10.

Further detail is provided on components of device 10. Device 10 is operable to conduct wireless telephone calls, using any known wireless phone system such as a Global System for Mobile Communications (GSM) system, Code Division Multiple Access (CDMA) system, CDMA 2000 system, Cellular Digital Packet Data (CDPD) system and Time Division Multiple Access (TDMA) system. Other wireless phone systems can include Bluetooth and the many forms of 802.11 wireless broadband, like 802.11a, 802.11b, 802.11g, etc. that support voice. Device 10 is a quad-band compatible device providing wireless communication capabilities with networks operating in any one or more of the 800, 900, 1800 and 1900 MHz frequency broadcast bands. Other embodiments include Voice over IP (VoIP) type streaming data communications that can simulate circuit-switched phone calls. Ear bud 26 can be used to listen to phone calls and other sound messages and microphone 28 can be used to speak into and input sound messages to device 10.

Figure 2:
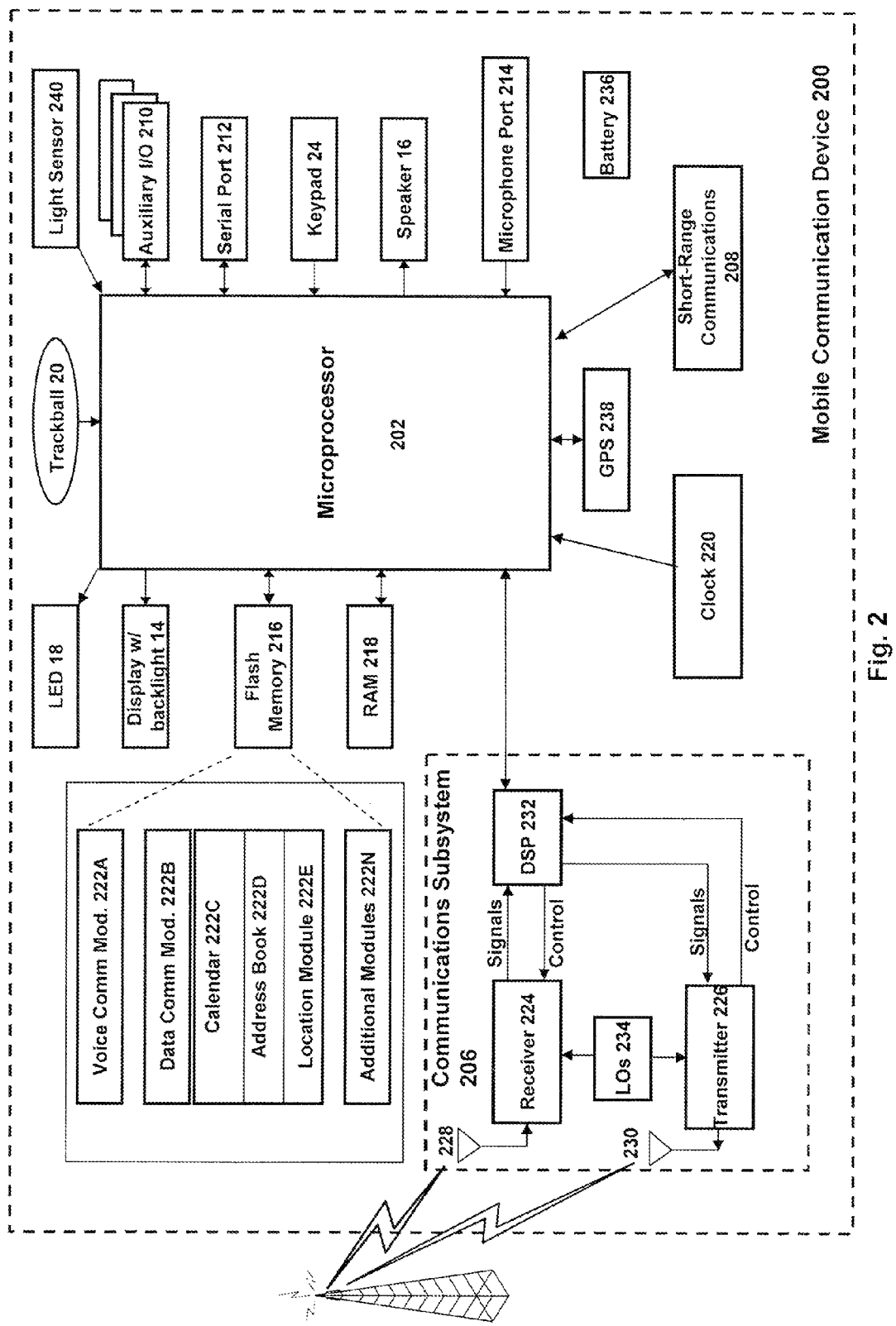
FIG. 2 is a block diagram of certain internal components and the RF transmission module of FIG. 1.

Referring to FIG. 2, functional components of device 10 are provided in schematic 200. The functional components are generally electronic, structural or electro-mechanical devices. In particular, microprocessor 202 is provided to control and receive almost all data, transmissions, inputs and outputs related to device 10. Microprocessor 202 is shown schematically as coupled to keypad 24 and other internal devices. Microprocessor 202 preferably controls the overall operation of the device 10 and its components. Exemplary microprocessors for microprocessor 202 include Data 950 (trade-mark) series microprocessors and the 6200 series microprocessors, all available from Intel Corporation. Microprocessor 202 is connected to other elements in device 10 through a series of electrical connections to its various input and output pins. Microprocessor 202 has an IRQ input line which allows it to receive signals from various devices.

Appropriate interrupt firmware is provided which receives and reacts to the signals detected on the IRQ line.

In addition to the microprocessor 202, other internal devices of the device 10 are shown schematically in FIG. 2. These include: display 14; speaker 16; keypad 24; communication sub-system 206; short-range communication sub-system 208; auxiliary I/O devices 210; serial port 212; microphone port 214 for microphone 28; flash memory 216 (which provides persistent storage of data); random access memory (RAM) 218; clock 220 and other device sub-systems (not shown). Device 10 is preferably a two-way radio frequency (RF) communication device having voice and data communication capabilities. In addition, device 10 preferably has the capability to communicate with other computer systems via the Internet.

Operating system software executed by the microprocessor 202 is preferably stored in a computer-readable medium, such as flash memory 216, but may be stored in other types of memory devices, such as read-only memory (ROM) or similar storage element. In addition, system software, specific device applications, or parts thereof, may be temporarily loaded into a volatile store, such as RAM 218. Communication signals received by the mobile device may also be stored to RAM 218.

Microprocessor 202, in addition to its operating system functions, enables execution of software applications on device 10. A set of software (or firmware) applications, generally identified as applications 222, that control basic device operations, such as voice communication module 222A and data communication module 222B, may be installed on the device 10 during manufacture or downloaded thereafter. As well, additional software modules, such as software module 222N, which may be for instance a personal information manager (PIM) application, may be installed during manufacture or downloaded thereafter into device 10. Data associated with each application can be stored in flash memory 216.

Communication functions, including data and voice communications, are performed through the communication sub-system 206 and the short-range communication sub-system 208. Collectively, sub-systems 206 and 208 provide the signal-level interface for all communication technologies processed by device 10. Various applications 222 provide the operational controls to further process and log the communications. Communication sub-system 206 includes receiver 224, transmitter 226 and one or more antennas, illustrated as receive antenna 228 and transmit antenna 230. In addition, communication sub-system 206 also includes processing modules, such as digital signal processor (DSP) 232 and local oscillators (LOs) 234. The specific design and implementation of communication sub-system 206 is dependent upon the communication network in which device 10 is intended to operate. For example, communication sub-system 206 of device 10 may operate with the Mobitex (trade-mark), DataTAC (trade-mark) or General Packet Radio Service (GPRS) mobile data communication networks and also operate with any of a variety of voice communication networks, such as Advanced Mobile Phone Service (AMPS), Time Division Multiple Access (TDMA), Code Division Multiple Access (CDMA), CDMA 2000, Personal Communication Service (PCS), Global System for Mobile Communication (GSM), etc. Other types of data and voice (telephonic) networks, both separate and integrated, may also be utilized with device 10. In any event, communication sub-system 206 provides device 10 with the capability of communicating with other devices using various communication technologies, including instant messaging (IM) systems, text messaging (TM) systems and short message service (SMS) systems.

In addition to processing communication signals, DSP 232 provides control of receiver 224 and transmitter 226. For example, gains applied to communication signals in receiver 224 and transmitter 226 may be adaptively controlled through automatic gain-control algorithms implemented in DSP 232.

In a data communication mode, a received signal, such as a text message or Web page download, is processed by the communication sub-system 206 and is provided as an input to microprocessor 202. The received signal is then further processed by microprocessor 202 which can then generate an output to display 14 or to an auxiliary I/O device 210. A device user may also compose data items, such as e-mail messages, using keypad 24, trackball 20 and/or some other auxiliary I/O device 210, such as a touchpad, a rocker switch, a trackball or some other input device. The composed data items may then be transmitted over communication network 140 via communication sub-system 206. Sub-system 206 may also detect when it is out of communication range for its remote systems.

In a voice communication mode, overall operation of device 10 is substantially similar to the data communication mode, except that received signals are output to speaker 16, and signals for transmission are generated by microphone 28. Alternative voice or audio I/O sub-systems, such as a voice message recording sub-system, may also be implemented on device 10. In addition, display 14 may also be utilized in voice communication mode, for example, to display the identity of a calling party, the duration of a voice call, or other voice call-related information.

Short-range communication sub-system 208 enables communication between device 10 and other proximate systems or devices, which need not necessarily be similar devices. For example, the short-range communication sub-system may include an infrared device and associated circuits and components, or a Bluetooth (trade-mark) communication module to provide for communication with similarly enabled systems and devices. Although not shown, sub-system 208 may be connected to transmitter 226 to provide physical transmissions of its signals.

Powering the entire electronics of the mobile handheld communication device is power source 236. In one embodiment, the power source 236 includes one or more batteries. In another embodiment, the power source 236 is a single battery pack, especially a rechargeable battery pack. A power switch (not shown) provides an "on/off" switch for device 10. A power source interface (not shown) may be provided in hardware, firmware, software or a combination of such elements to selectively control access of components in device 10 to power source 236. Power from source 236 may be provided to one or more components in device 10, including components in transmitter 226. Voltages from battery 236 may be provided to voltage regulators (not shown) in device 10, for subsequent use by components in device 10. Upon activation of the power switch an application 222 is initiated to turn on device 10. Upon deactivation of the power switch, an application 222 is initiated to turn off device 10. Power to device 10 may also be controlled by other devices and by software applications 222.

Figure 3:
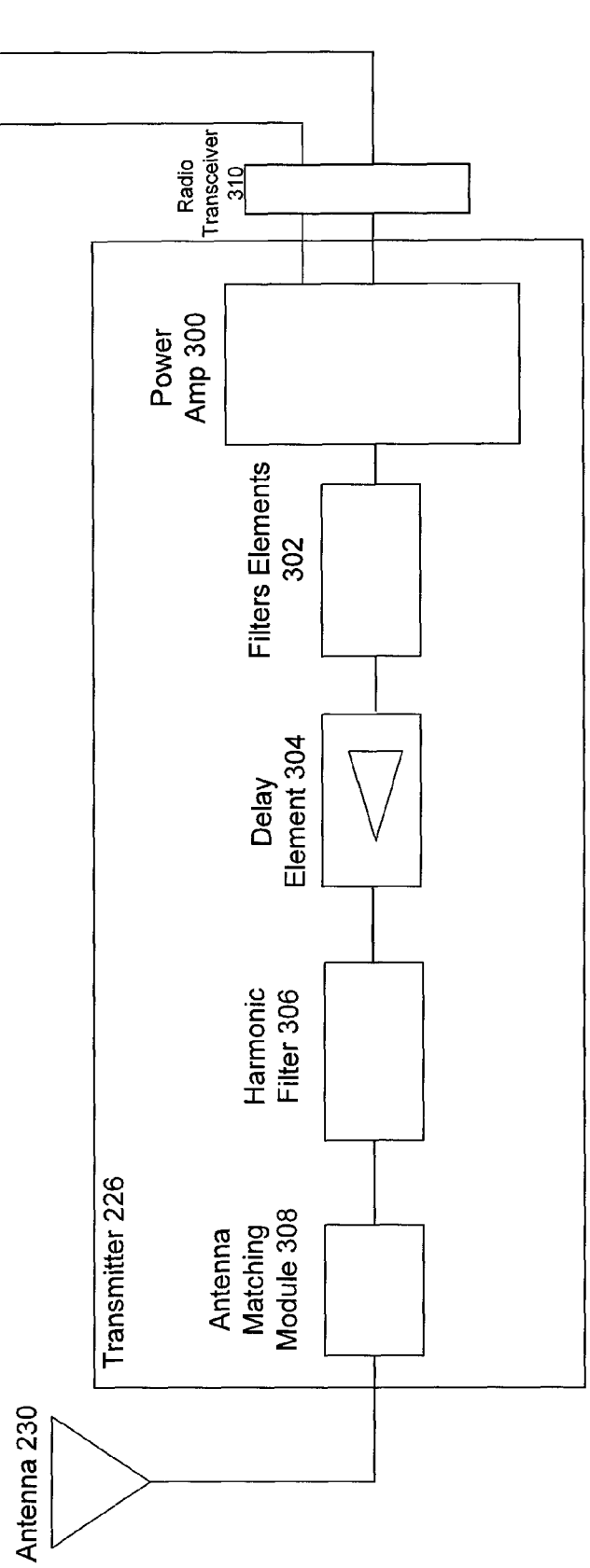
FIG. 3 is a block diagram of the RF transmission module of the device of FIG. 1.

Further detail is now provided on aspects of an embodiment relating to a system and method for controlling an RF transmission from device 10. Referring to FIG. 3, further detail on transmitter 226 is shown. Therein, transmitter 226 comprises power amplifier 300 which sends and receives signals to and from RF transceiver 310. Signals provided from DSP 232 to transmitter 226 through transceiver 310 include signals that are ultimately destined to be converted into an analog radio signal that is modulated and transmitted as a wireless signal through antenna 230. Signals provided from transmitter 226 to DSP 232 include operational signals relating to the modulation of the signals provided by DSP 232. In transmitter 226, signals from DSP 232 are provided to power amplifier 300. An exemplary power amplifier is 6037R2 Freescale (trademark). As noted in the background section, one factor in the amount of unwanted radio frequency noise is the electrical matching of transmitter 226 to power amplifier 300. Power amplifier 300, as shown, may produce less additional noise if transmitter 226 appears as about a 50 ohm load to the output of amplifier 300.

The following components are provided in the output path of an output signal generated by amplifier 300 that is destined for transmission through antenna 230. First, the raw output from power amplifier 300 is provided as an analog signal having a voltage signals to filter module 302, which provide some initial filtering of the raw signal. After filter module 302, the (filtered) signal is provided to delay element 304, which functionally provides a time delay of the output signal without attenuating its output levels. After the output signal is delayed, it is provided to harmonic filter 306. Harmonic filter 306 further shapes the output signal to filter signals outside of a predetermined frequency range. In one embodiment, delaying the output signal delay element 304 before having harmonic filter 306 further shape the signal provides additional attenuation of harmonics in the output signal.

The output of harmonic filter 306 is provided to antenna matching module 308, which provides some frequency matching circuits for the output signal. The output signal from module 308 is provided to antenna 230 which converts the analog signal into a wireless radio signal that is broadcasted from device 10.

It will be appreciated that in other embodiments, different arrangement of the modules shown in FIG. 3 may be provided. As an example, filter elements 302 and delay element 304 may be switched in order of location from the output of power amplifier 300. As a further example, elements in harmonic filter 306 and delay element 304 may be switched in order of location from the output of power amplifier 300. Further additional modules may be provided or selected modules may be removed from transmitter 226. A notable feature of any arrangement is that the delay element is preferably located in the chain of components prior to elements that provide the substantial filtering of harmonics, such as the circuits provided in harmonic filter 306.

Figure 4:
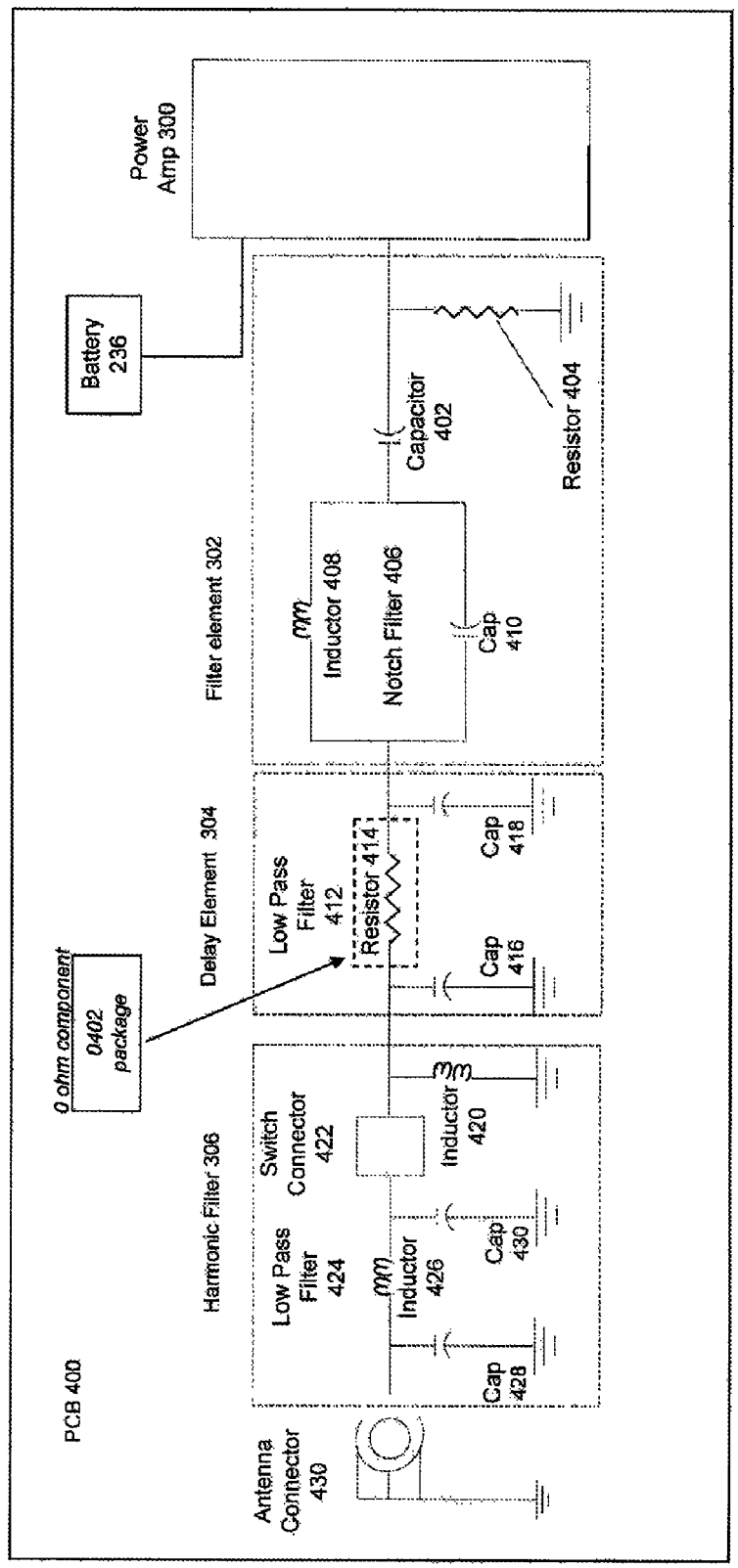
FIG. 4 is a schematic diagram of the RF transmission module of FIG. 3.

Referring to FIG. 4, further detail is provided on the element shown in the block diagram of transmitter 226 in FIG. 3, shown mounted on printed circuit board (PCB) 400. As a physical implementation for transmitter 226, its components and circuits typically are provided on PCB 400. As is known in the art, a PCB provides a substrate for mounting and securing components of a circuit thereto. Electrical connections between components in the circuit can be provided by conductive tracks embedded in the PCB that run between the related terminals of the connected components. Specific locations are provided for components of the circuit and the locations are frequently shown in an outline with any circuit reference identifiers in a silk screen on the PCB. On the PCB, conductive pads on the surface of the PCB are provided to align with the terminals for the components of the circuit. The pads provide the contact point for the terminals to the tracks. When assembling the components of the circuit onto the PCB, an automated "pick and place" insertion machine in the manufacturing line can be loaded with the relevant components for the circuit and can be programmed to insert the components at their predetermined location on the PCB. Some components in the circuit may be surface mount packages; others may be through-hole components; still other components may require manual insertion into the proper location on the PCB. As components are provided in a series of standardized package sizes, it is possible to place a different component in the location for an intended component in the circuit.

Filter module 302 of FIG. 3 is shown in FIG. 4 and provides power and impedance matching of the output circuit attached to the output of power amplifier 300. The tuning of the impedance and power characteristics of an input point of the circuit may not match with the exact characteristics of the output of the amplifier. One part of the filter module is a notch filter. The filter comprises capacitor 402, resistor 404, inductor 408, and capacitor 410, providing a notch filter to reduce the harmonics around 5 GHz. Capacitor 402 is another component in module 302 and is placed in series with the output of amplifier 300 for RF coupling and DC blocking. Resistor 404 is another component in module 302 acts as a shunt to ground for the RF stability of the power amplifier. As parts of module 302 are implemented preferably to provide power and impedance signal matching for amplifier 300, components of module 302 are preferably placed as close as possible to the output of amplifier 300.

The output of notch filter 406 is provided to delay element 304. In circuit 400, delay element 304 is presented as a circuit template and as a second low pass filter 412, comprising resistor 414 placed in series to the output from notch filter 406 with capacitors 416 and 418 placed as shunts to ground on each terminal of resistor 414. The output of delay element 304 is provided to inductor 420 which acts as an electrostatic protection component for errant discharges received from antenna 430 to prevent such discharges from reaching power amplifier 300. As such, it is preferable that inductor 420 be placed as close as possible to antenna 430.

For the embodiment, delay element 304 is implemented by replacing components for low pass filter 412 with selected, electrically neutral components. In particular, delay element 304 is implemented by populating the location for resistor 414 in the PCB of device 10 with an 0 ohm component and not populating components in locations for capacitors 416 and 418. As such, the delay provided by delay element 304 is the propagation time taken for the output signal to traverse through the track on the PCB of device 10 connecting the output of filter 406 through the 0 ohm component to inductor 420. In one embodiment the physical package for the 0 ohm resistor is a "0402" sized component. It will be appreciated that any 0 ohm-rated component may be used in the location for device 414, including 0 ohm components and in certain implementations, and specially implemented tracks in the PCB of device 10, as described below. In other embodiments, delay element 304 may be moved to be located between inductor 426 and switch connector 422. In other embodiments, delay element 304 (or its equivalents) may be placed anywhere between the output of amplifier 300 and the input to filter 424 (or its equivalent).

In other embodiments, the amount of time of the delay may be shortened by effectively reducing the length of the track in the connection between power amp 300 and filter 304 in the PCB. In other embodiments, the delay amount may be lengthened by effectively increasing the length of the track in the connection between power amp 300 and filter 304 in the PCB. Lengthening the length of the track may be effectively accomplished by having a series of 0 ohm resistors located in the track. Also, different 0 ohm resistors may have different signal timing propagation characteristics that may be used as part of the timing for the delay in element 304. In some embodiments, it may be possible to insert an inductor in place of a 0 ohm resistor or in addition to a 0 ohm resistor. Use of an inductor generally changes the phase of the output signal. As such, use of an inductor may be appropriate for distinct circuit and timing parameters for the delay element 304.

In other embodiments, the delay may be provided by a functioning low pass filter populated into the components of low pass filter 412. The functioning low-pass filter may be designed to provide a portion of a low-pass filter required by the parameters of the output for power amplifier 300. Use of such a functioning low pass filter will effect the phase of the output signal. In other embodiments, it may be possible to use a high pass, band pass or notch filter with specific operational parameters to populate the components in filter 412.

Further still, in other embodiments, additional tracks or circuits may be provided on the PCB and may be selectively bridged into the signal path of delay element 304. For example, a separate parallel track may be provided in the PCB, with a first gapped connection point at or near the physical junction of the common terminal for resistor 414 and capacitor 418 and a second gapped connection point at or near the physical junction of the common terminal for resistor 414 and capacitor 416. The gaps of the connection points may be bridged by the population of a 0 ohm resistor at each point. The separate parallel track may also have additional circuitry or pads for such circuitry provided therein. Alternatively, one end of the parallel track may be connected at one junction point and another end of the parallel track may have the gapped connection point to another junction point. Alternatively or additionally, a specific track may be laid in PCB as part of a connection point between any components in the circuit of transmitter 226 that imparts a known signal propagation delay for a voltage traversing the length of the track, thereby imparting a comparable delay as provided by the delay element, or its equivalents as described above. The track may be placed at any appropriate location, as described above for the delay element between components prior to the harmonic filter.

From delay element 304, the next stage for the output harmonic filter 306 consists of switch connector 422 and harmonic filter 306. Switch connector 422 may provide an additional delay to the output signal as it traverses through it on its way to harmonic filter 306. The switch connector is used as a device to selectively "open" the switch from its normally closed state, allowing measurement of RF signals of the output of the device during testing, manufacturing or repair. Harmonic filter 306 is a low pass filter 424 consisting of inductor 426 and capacitors 428. Capacitors 428 are located on each terminal of inductor 426 and they each provide a shunt to ground. The output of the low pass filter 424 is the output of filter 306 and is provided to antenna connector 430. In the embodiment, the low pass filter provides a pass band from DC to 2 GHz. It is used to attenuate harmonics above 3.4 GHz, representing the second and third harmonics of signals in the DCS band (1747 MHz) and PCS band (1880 MHz).

It would be appreciated that the specific values of the elements in FIG. 4 can be selected to tune for various frequencies to allow signals in different frequencies to pass or to attenuate signals in selected frequency ranges.

In other embodiments, different PCB tracks may be provided for the components in the output circuit for transmitter 226. As such, delay element 304 may be replaced with a dedicated, calibrated delay component and pads for capacitors 416 and 418 may be eliminated.

Figure 5A:
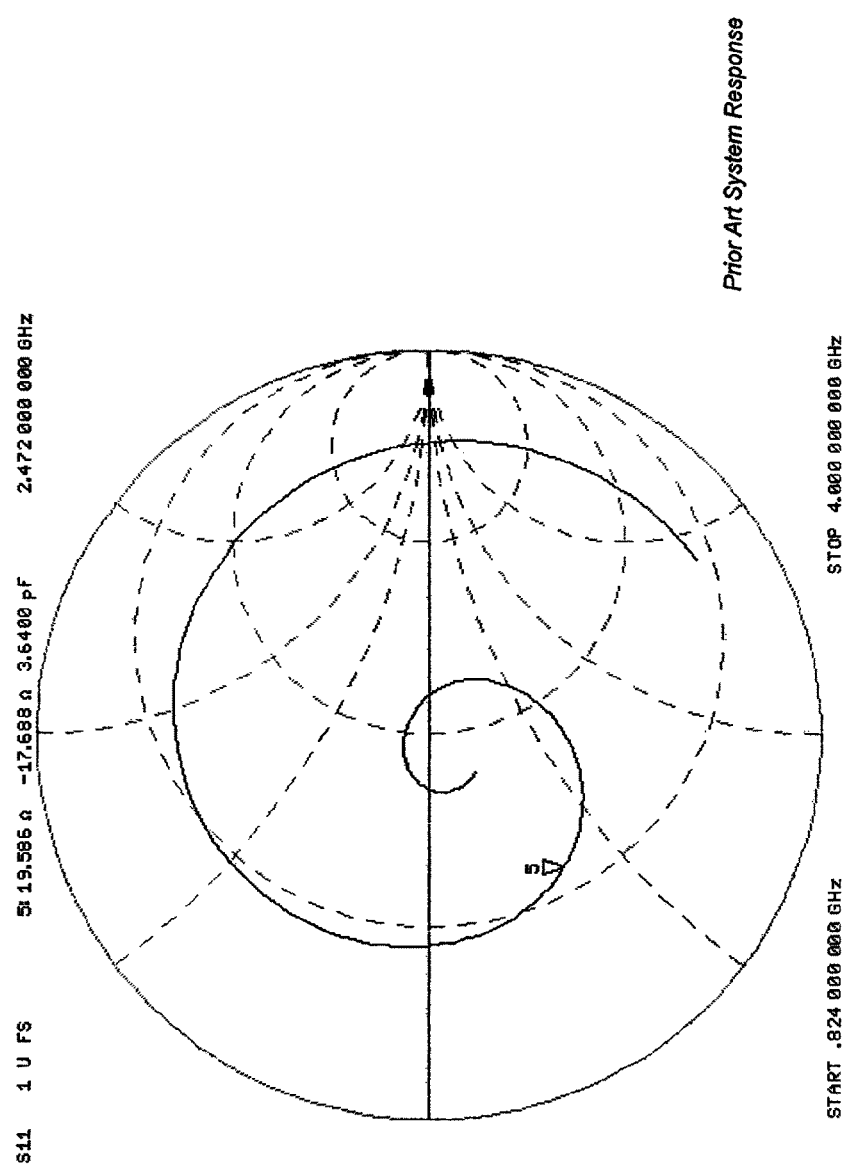
FIG. 5A is a Smith chart of original impedance presented to an output of a power amplifier of a prior art system.
Figure 5B:
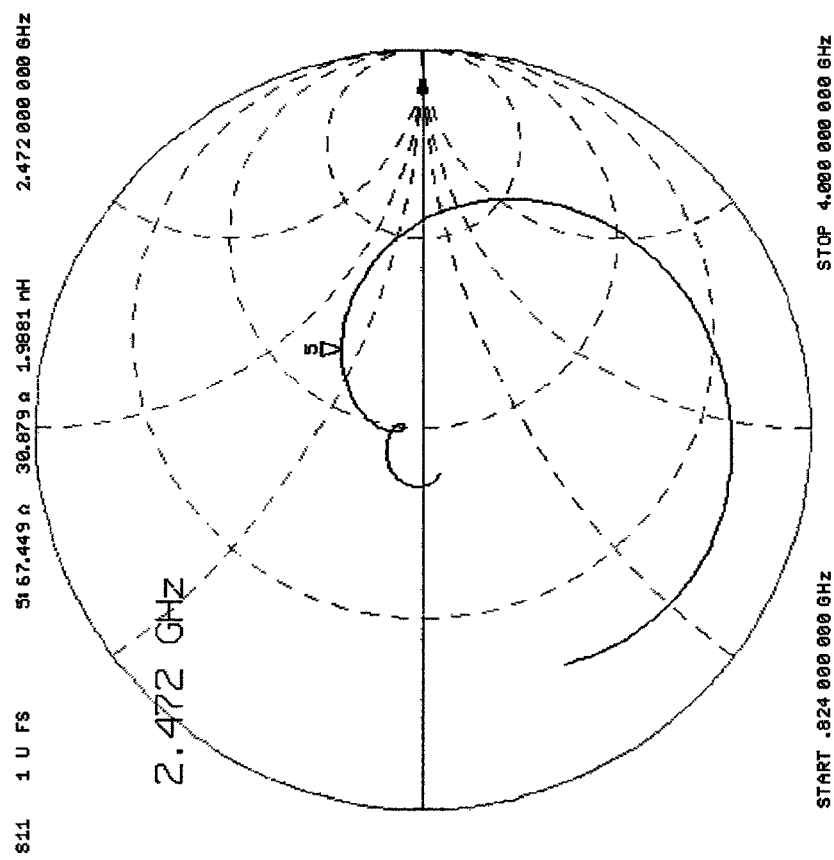
FIG. 5B is a Smith chart of the impedance presented to the output of the power amplifier with delay element added to the transmission module of FIG. 3.

FIG. 5A shows a Smith plot of an exemplary output real and imaginary components of a prior art RF transmission circuit. FIG. 5B shows a Smith plot of real and imaginary output components from the circuit of FIG. 4. In comparison with FIG. 5A, the chart in FIG. 5B shows that the location of mark 5 at 2.472 GHz, which is the third harmonic of 824 MHz, is significantly changed due to the delay element.

Figure 6:
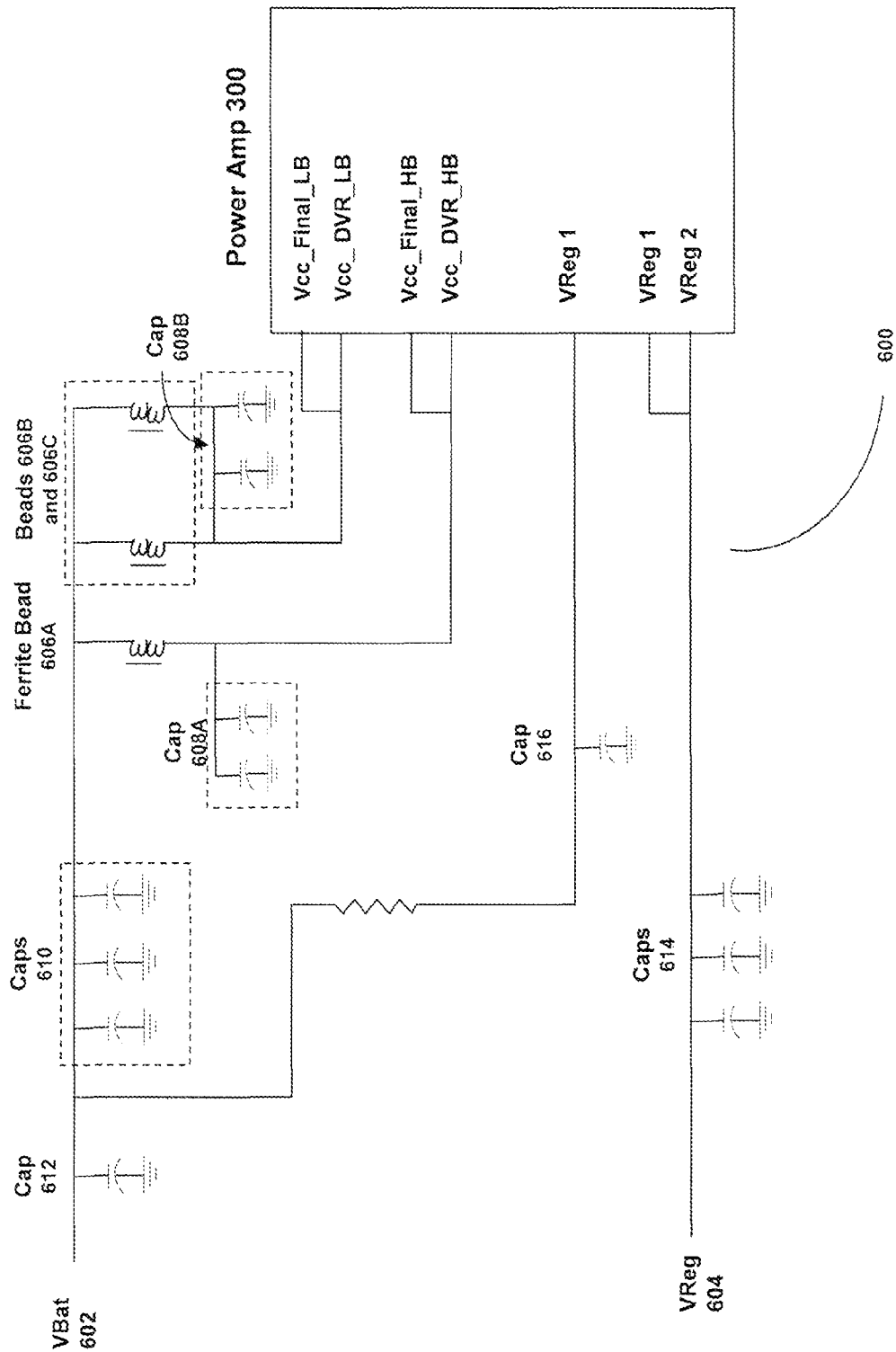
FIG. 6 is a schematic diagram of additional circuits relating to the RF transmission module of FIG. 2.

Referring to FIG. 6, schematic 600 shows additional filtering components around power amplifier 300. As noted in the background section above, an unwanted source of radio frequency transmissions is leakage transmissions that are emitted from power amplifier 300 to its supply battery through the connecting tracks on the PCB. The filters assist in reducing these unwanted noise transmissions, thereby reducing the amount of noise and additional harmonics imposed on the output signal of power amplifier 300 through the battery such as battery 236. For the operating parameters of an embodiment, the filtering may be set to attenuate signals above 2 GHz.

Power amplifier 300 generates output signals using RF signal provided by the transceiver. The supply voltage for amplifier 300 originates from battery 236. Two power supplies are provided, namely VBat signal 602 and VReg signal 604. VBat is a high current, 3.8 volt DC supply. VReg is low current voltage input to internal voltage regulator (not shown) in device 10 and is a 2.7 volt DC supply.

VBat signal 602 is provided to power amplifier 300 through ferrite beads 606 to the Final and Driver voltage input terminals for the low band (LB) and high band (HB) power input pin for amplifier 300. Beads 606 are inductors providing high energy chokes, absorbing high frequency signals emanating from amplifier 300 to VBat. Any equivalent high frequency choke may be used. Ferrite beads 606 are placed in series in each power track between VBat 604 and power amplifier 300. Bead 606A is located between the HB power signal and VBat. In the PCB track connecting the battery to the LB power lines, a set of beads 606B and 606C may be placed in parallel in the circuit to increase the amount of filtering provided.

Also, capacitors sets 608A and 608B are located between the outputs of beads 606 and the input pin of amplifier 300. Capacitors 608A are 0.01 µF and 1000 pF. Capacitors 608B are 33 pF and 0.01 µF. Capacitors 608A and 608B filter feedback harmonics leaking from amplifier 300 that radiate along the tracks of PCB that ultimately connect VBat signal 602 to amplifier 300.

Capacitors 610 have a nominal value of 10 pF and are located on the input side of beads 606 between the input terminals of beads 606 and VBat 602 signal. Capacitors 610 also act to filter radio frequency harmonics from amplifier 300.

Capacitor 612 has a nominal value of 100 µF and is located near capacitors 610 on the same track. Its relatively large value is selected to filter out second harmonics from amplifier 300.

It will be appreciated that other filter circuits and other values for capacitors shown in FIGS. 4 and 6 may be provided in other embodiments. The target frequencies for the filters can be changed depending on the target fundamental transmission frequency and its harmonics. However, for the circuits as shown, their filters are designed to operate around the 2 GHz bandwidth range as device 10 as described, provides quad-band communications, which may generate second, third, fourth and other harmonics generated around any transmissions for the 800, 900, 1800, and/or 1900 MHz frequency bands. It will be appreciated that other filtering systems may be provided for other transmission bands and/or other harmonics.

In other embodiments, a method of attenuating harmonics of an output signal may be provided by implementing filtering and delay steps comparable to filtering and delay components described in the circuits herein.

The present disclosure is defined by the claims appended hereto, with the foregoing description being merely illustrative of embodiments of the disclosure. Those of ordinary skill may envisage certain modifications to the foregoing embodiments which, although not explicitly discussed herein, do not depart from the scope of the disclosure, as defined by the appended claims.

The invention claimed is:

1. An electronic circuit for reducing leakage of radio frequency signals from a power amplifier of a wireless communication device, comprising:
   a printed circuit board (PCB) having the power amplifier mounted on the PCB;
   a first electrical track in the PCB providing part of a connection from a high band power input terminal of the power amplifier to a battery terminal;
   a first capacitor connected to the first electrical track, the high band power input terminal and a ground reference in the PCB;
   a second capacitor connected in parallel to the first capacitor and connected to the first electrical track, the high band power input terminal and the ground reference;
   a first high filter choke having a first end connected to the first electrical track and a second end connected to the battery terminal;
   a second electrical track connected to a low band power input terminal of the power amplifier; and
   a second high filter choke a having a first end connected to the second electrical track and a second end connected to the battery terminal.

2. The electronic circuit as claimed in claim 1, wherein the first capacitor provides part of a low pass filter to attenuate signals over 2 GHz.

3. The electronic circuit as claimed in claim 1, wherein the first capacitor has a capacitance of 0.01 uF or 1000 pf.

4. The electronic circuit as claimed in claim 1, wherein a third capacitor is provided between the first high filter choke and the battery.

5. The electronic circuit as claimed in claim 4, wherein the third capacitor provides a low pass filter to attenuate signals over the 2 GHz frequency band.

6. The electronic circuit as claimed in claim 1, wherein the second capacitor has a capacitance of 0.01 uF or 33 pf.

7. The electronic circuit as claimed in claim 6, further comprising a third capacitor connected to the second track.

8. The electronic circuit as claimed in claim 1, further comprising:
   a filtering stage connected to an output terminal for an output signal of the power amplifier;
   a harmonic filter providing a low pass filter having a frequency cut-off point that attenuates first order harmonics of the output signal; and
   a 0 ohm component located between the filtering stage and the harmonic filter to delay the output signal from the power amplifier.

9. The electronic circuit as claimed in claim 8, wherein:
   the 0 ohm component is populated in a location for one component for the low pass filter, the location providing a connection between the filtering stage and the harmonic filter; and
   components for the low pass filter are not populated in remaining locations for other components of the low pass filter.

10. The electronic circuit as claimed in claim 1, further comprising:
    a circuit implemented on the PCB and connected to an output terminal of the power amplifier for an output signal from the power amplifier, the circuit comprising a first filtering module and a harmonic low pass filter, the first filtering module connected to a 0 ohm resistor which is connected to the harmonic low pass filter, wherein
    the 0 ohm resistor provides a delay element for the output signal to reduce harmonics in the output signal;
    the harmonic low pass filter attenuates second and third harmonics of the output signal; and
    the first and the second capacitors reduce transmission of radio frequency signals from the high band input terminal of the power amplifier in the first electrical track to the battery terminal.

11. An electronic circuit for reducing leakage of radio frequency signals from a power amplifier of a wireless communication device, comprising:
    a printed circuit board (PCB) having the power amplifier mounted on the PCB;
    a first electrical track in the PCB connecting to a high band power input terminal of the power amplifier;
    a first capacitor connected to the first electrical track and a ground reference in the PCB, the first capacitor reducing transmission of radio frequency signals from the high band power input terminal of the power amplifier;
    a first high filter choke having a first connection connecting to the first electrical track and the first capacitor and a second connection connecting to a battery terminal;
    a second capacitor connected to the first electrical track between the input terminal and the first high filter choke;
    a second electrical track connected to a low band power input terminal of the power amplifier;
    a second high filter choke a having a first end connected to the second electrical track and a second end connected to the battery terminal;
    a third capacitor connected to second first electrical track between the low band power input terminal and the second high filter choke; and
    a fourth capacitor connected to the first and second high filter chokes and the battery terminal.

12. The electronic circuit as claimed in claim 11, wherein the third capacitor provides a low pass filter to attenuate signals over the 2 GHz frequency band.

13. The electronic circuit as claimed in claim 11, wherein the first capacitor provides a low pass filter to attenuate signals over the 2 GHz frequency band.

14. The electronic circuit as claimed in claim 11, further comprising:
    a filtering stage connected to an output terminal for an output signal of the power amplifier;
    a harmonic filter providing a low pass filter having a frequency cut-off point that attenuates first order harmonics of the output signal; and
    a 0 ohm component located between the filtering stage and the harmonic filter to delay the output signal from the power amplifier.

* * * * *